United States Patent [19]

McKenzie et al.

[11] 4,437,067
[45] Mar. 13, 1984

[54] TRANSIENT ERROR REDUCTION FOR STORED CHARGED CIRCUITS

[75] Inventors: Joe A. McKenzie, Ridgecrest, Calif.; Gary D. Lowe, Prague, Okla.

[73] Assignee: The United States of America as represented by the Secretary of the Navy, Washington, D.C.

[21] Appl. No.: 187,124

[22] Filed: Sep. 2, 1980

[51] Int. Cl.³ .................. H03B 1/00; H03B 1/04; H03K 5/00; H04B 1/10
[52] U.S. Cl. .................................................. 328/167
[58] Field of Search .............. 361/111; 330/86, 51, 330/207 P; 328/167, 215; 307/602, 603, 520

[56] References Cited

U.S. PATENT DOCUMENTS

| | | | |
|---|---|---|---|
| 3,729,666 | 4/1973 | Kelly | 330/86 X |
| 4,005,373 | 1/1977 | Salesky et al. | 330/86 X |
| 4,054,845 | 10/1977 | Glogolja et al. | 330/207 P |
| 4,060,771 | 11/1977 | Melcher et al. | 328/167 |
| 4,072,906 | 2/1978 | Schröder | 330/86 |
| 4,181,896 | 1/1980 | Schröder | 330/86 X |
| 4,224,581 | 9/1980 | Watanabe et al. | 330/86 X |

Primary Examiner—Theodore M. Blum
Attorney, Agent, or Firm—R. F. Beers; W. Thom Skeer; W. D. English

[57] ABSTRACT

A stored charge circuit having a transient error such as a ringing or the like in response to a step function or other transient error initiating input signal is presented. Normally open switches are connected across at least some of the resistors of the circuit and are closed for an interval of time upon the occurrence of a transient error thereby changing the transient error.

5 Claims, 5 Drawing Figures

U.S. Patent    Mar. 13, 1984    4,437,067
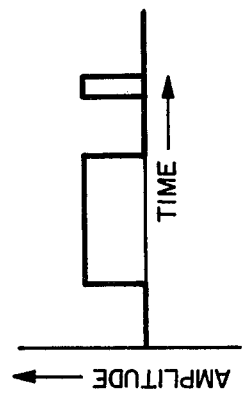
FIG. 3
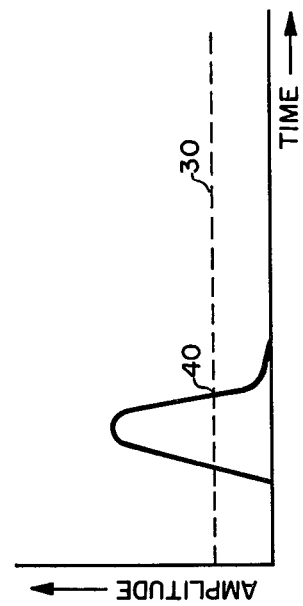
FIG. 2c
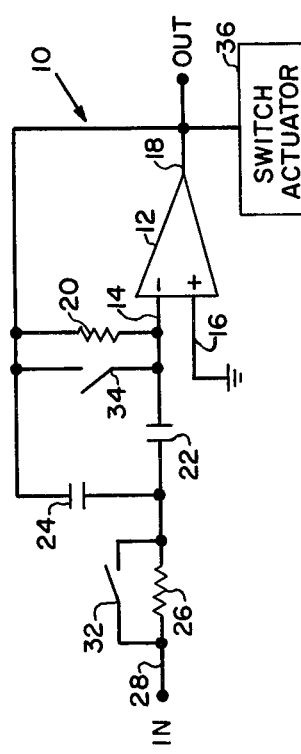
FIG. 1
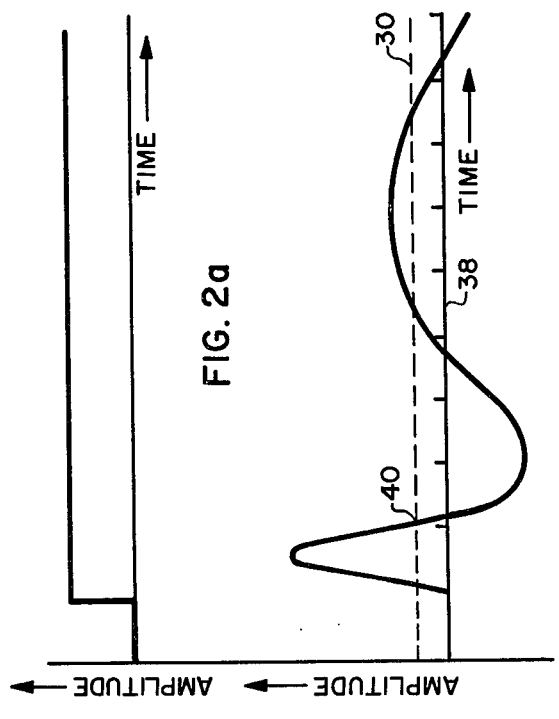
FIG. 2a
FIG. 2b

TRANSIENT ERROR REDUCTION FOR STORED CHARGED CIRCUITS

BACKGROUND OF THE INVENTION

The present invention relates to stored charge circuits having transient error, and more particularly, to active bandpass filter circuits having a ringing response or the like to a step function or other transient error initiating input signal.

It is well known in the prior art that the transient response of circuits having reactive components have a transient error in response to sharply changing input signals such as step functions, pulses, square waves, or the like. For example, in a very simple application, an RC time constant charging circuit can be designed to exhibit a critically damped response in which case the output has a single overshoot of predetermined amplitude but quick response time. Another example is an overly damped response where there is no overshoot response but the response time for the output of the circuitry to acquire the quiescent condition is much longer than that for a critically damped response. A further example is an underdamped response where there is a ringing about the long term quiescent output value with the sequential amplitudes decreasing with time. Similar transient error effects are exhibited by passive RC networks connected as low pass, high pass, bandpass filters, or ladder networks.

In active circuits, this transient error is particularly troublesome in feedback circuits having a plurality of complex poles such as in active filter circuits and feedback control systems of servo mechanisms where a ringing or an underdamped response will cause the mechanism to hunt. This hunting characteristic, due to the transient error response of the feedback servo control circuits, often presents a major design problem affecting the response time of the servo mechanism and the accuracy with which the servo mechanism will follow the control signal.

Such a transient error response is usually attributable to delay in capacitors of stored charge circuits from achieving their final charge or voltage due to associated resistances in the circuitry. If the capacitors of the circuit could achieve their steady state charge voltage as determined by the input signal without inhibition from the circuit resistances, the transient error of the circuit would be significantly reduced and the circuit would be more rapidly reset to enable the circuit to respond to the next closely time spaced signal without any overhang interference from the preceeding signal. Accordingly, it is desirable to reduce the transient error of stored charge circuits in response to step functions and other fast rise time input signals.

SUMMARY OF THE INVENTION

A stored charge circuit wherein the output response to an applied input signal includes a transient error is presented. The output of the circuit is sensed for determining the presence of the transient error and upon such determination, switching means connected across and shunting at least some of the resistors of the stored charge circuit are closed for a predetermined interval of time thereby eliminating the presence of the transient error for a subsequent time interval and resetting the circuit to receive the next immediately following signal.

OBJECTS OF THE INVENTION

With reference to the background of the invention hereinabove, accordingly, it is an object of the present invention to provide a means for eliminating transient error of a stored charge circuit.

Another object of the present invention is to provide a switchable short circuit across resistors of a stored charge circuit for eliminating transient error of the circuit.

A further object of the present invention is to provide a switching means in a stored charge circuit for shorting out resistors of the circuit for a predetermined time interval initiated at a predetermined output.

Still another object of the present invention is to provide a bandpass filter circuit wherein short circuits are switchably shuntable across resistors of the filter circuit for eliminating transient error.

Further objects and advantages of the present invention will become apparent as the following description proceeds and the features of novelty characterizing the invention will be pointed out with particularity in the claims annexed to and forming a part of this specification.

BRIEF DESCRIPTION OF THE DRAWINGS

For a better understanding of the present invention reference may be had to the accompanying drawings wherein:

FIG. 1 is an exemplary embodiment of a circuit including the present invention;

FIG. 2a shows an exemplary input signal to the circuit of FIG. 1;

FIG. 2b shows an output response of the circuit of FIG. 1 to the input signal of FIG. 2a, showing the transient error of the output;

FIG. 2c shows the output of FIG. 2b with transient error correction; and

FIG. 3 shows another example of an input signal to the circuit of FIG. 1 which would also cause transient error.

DESCRIPTION OF THE PREFERRED EMBODIMENT

Referring now to the Figs. wherein the same reference numerals have been applied to like parts, FIG. 1 shows an active bandpass filter, generally designated 10, utilizing the present invention. It is understood that the bandpass filter of FIG. 1 is but one of the many possible embodiments of the present invention, which can also be included in low pass filters, high pass filters, parallel "T" filters, bridged "T" filters, Cshebyschev filters, Butterworth filters, Bessel filters, or any other stored charge circuits which are defined as electronic circuits comprising resistors and capacitors and having a transient error response, including ladder networks, feedback servo control circuits, and exponential circuits, all of these circuits being either active or passive and having single pole or complex pole pairs.

The basic bandpass filter of FIG. 1 is a standard bandpass filter as shown on page 282 of a book by Burr-Brown Corp. entitled "Operational Amplifiers", published by the McGraw-Hill Book Co., Copyright 1971, and edited by Tobey, Graene, and Huelsman. Additionally, this book contains many other stored charge circuits with which the present invention is applicable.

The bandpass filter of FIG. 1 comprises an operational amplifier 12 having an inverting input 14, a non-inverting input 16, connected to a circuit ground, and an output 18. A feedback resistor 20 is connected between the output 18 and the inverting input 14 with one terminal of a capacitor 22 being connected to the inverting input 14. A capacitor 24 is connected between the output 18 and the other terminal of the capacitor 22 which in turn is also connected to an input resistor 26 which is connected to the circuit input 28 for receiving a signal having a sharp transient rise time such as shown in FIGS. 2a and 3 which would cause a transient error at output 18. The operation of such a bandpass filter circuit is presented in the above cited book on operational amplifiers as well as in many other reference sources. The circuit of the exemplary embodiment has a nominal passband of 10 Hz to 180 Hz and once disturbed by a transient input signal will normally ring from 70 milliseconds to 100 milliseconds after the transient of the input signal has stopped.

Referring now to FIG. 2a, there is shown a step input signal to terminal 28 and in FIG. 2b there is shown a typical output of the circuit 10 to the input of FIG. 2a, showing the transient error response and ringing about a threshold crossing or decisional output level 30. This phenomenon is characteristic of such bandpass filters. The problem arises when it is desired to detect the initial disturbance and a second disturbance as exemplified in the step and pulse signals shown in FIGS. 2a and 3 within 5 milliseconds to 50 milliseconds after the initial input transient. To accomplish the detection of the second transient input it is necessary to eliminate the transient error at the output 18 within a suitable time interval. Such would require about 2 milliseconds to eliminate the filter ringing and permit the filter circuit to resume a fully operational state for receiving the second closely time spaced input transient.

The solution to this problem as shown in the embodiment of FIG. 1, comprises the placing of switches 32, 34 respectively across resistors 26, 20. The switches 32, 34 comprise switchable short circuits in the exemplary embodiment, but can also be a resistance path having substantially less resistance than the respective resistor with which the switch is wired in parallel, e.g., having a resistance less than 1/10 of the resistor shunted. The switches 32, 34 can be electronic switches such as transistors or CD4016 commercially available integrated circuits or the like, manual switches, relays, or any other form of switch which can be actuated within the required time interval by a threshold level detector or the like.

The signal at the output 18 is monitored by a switch actuator 36 which is operably connected for actuating the switches 32, 34 from the normally open position to a closed position for a predetermined time interval and then causing the switches 32, 34 to open. Thus, the switches 32, 34 are normally open and have no effect on the operation of the filter, i.e., the filter behaves in an ordinary manner including an initial transient error. Once a decisional output level 30 is reached, the switches 32, 34 are closed by switch actuator 36 for about 2 milliseconds and then reopened. When the switches 32 and 34 are closed, the transient error which in the present case is a ringing, is quickly eliminated. In the exemplary embodiment, the switch actuator 36 is actuated upon the second cross-over 40 of the threshold crossing 30 and the resulting transient error waveform is shown in FIG. 2c. When the switches 32 and 34 are reopened before a second input signal is received, the filter 10 quickly assumes a new input state and is ready for the second transient input signal. It is within the contemplation of the present invention that input voltage detection means be used to assure that the switches 32, 34 are open upon the occurance of an input signal.

The switch actuator 36 in the exemplary embodiment is sensitive to a predetermined threshold level 30 shown in FIG. 2b. When the signal at output 18 approaches this threshold level, the circuitry of switch actuator 36 senses that a transient error exists and the switches 32, 34 are closed to prevent further ringing of the circuit. The threshold decisional level 30 above the abscissa 38 can be used to detect ringing or overshoots. If the threshold crossing 30 is placed at the abscissa 38, it can detect any overshoots, or if placed below the abscissa 38 it can determine an undershoot such as for an overly damped circuit response for a charging circuit, and the reverse being true for a discharging circuit. The decisional threshold 30 need not be a voltage threshold but can also be a slope or a slew rate threshold as appropriate to the particular circuit. Thus, the switch actuator 36 having determined upon a first or subsequent crossing of the threshold level 30 as appropriate for the particular circuit that there is a transient error, will cause switches 32, 34 to close momentarily with the magnitude of the predetermined time interval being chosen as appropriate for the particular circuit. Switches 32, 34 in the exemplary embodiment, have been placed across all resistors in the circuit, i.e., 26, 20, however, it is not necessary that all resistors be shunted and in more complex circuitry the shunting of only some resistors may be sufficient.

Thus, there is shown a stored charge circuit having a transient error such as a ringing or the like in response to a step function or other transient error initiating input signal. Normally open switches are connected across at least some of the resistors of the circuit and are closed for a time interval upon the detection of the transient error thereby reducing or eliminating the transient error for a time interval thereafter and resetting the stored charge circuit to receive a subsequent input signal.

While there has been illustrated and described what is at present considered to be a preferred embodiment of the present invention, it will be appreciated that numerous changes and modifications are likely to occur to those skilled in the art and it is intended in the appended claims to cover all those changes and modifications which fall within the true spirit and scope of the present invention.

What is claimed as new and desired to be secured by Letters Patent is:

1. An electronic circuit for eliminating transient error in a stored charge circuit without altering a transfer function, comprising:
   amplification means having an inverting input for receipt of an input signal having a sharp transient rise time, a non-inverting input referenced to ground, and an output;
   an input lead coupling said inverting input of said amplification means to an outside source, and having an input resistor in series with an input capacitor, said input capacitor being coupled between said input resistor and said inverting input of said amplification means for differentiation of said input signal;
   a normally open input switch coupled to said input lead in parallel with said input resistor for shunting said input resistor on command;

a first feedback lead having a feedback resistor coupling said output of said amplification means to said inverting input of said amplification means;

a normally open feedback switch coupled to said first feedback lead in parallel with said feedback resistor for shunting said feedback resistor on command;

a second feedback lead having a feedback capacitor coupling said output of said amplification means to said input lead at a junction between said input resistor and said input capacitor for integration of said input signal; and switching actuator means coupled to said output of said amplification means and having a switching command output coupled to said input switch and said feedback switch for providing a close command for a predetermined time interval to said input switch and said feedback switch to shunt said input resistor and said feedback resistor, after a pulse passes through said amplification means.

2. An electronic circuit according to claim 1 wherein said amplification means comprises an operational amplifier.

3. An electronic circuit according to claim 1 wherein said stored charge circuit is a filter circuit.

4. An electronic circuit according to claim 1 wherein said filter circuit is a passive filter circuit and an active filter circuit.

5. An electronic circuit according to claim 1 wherein said filter circuit is a bandpass filter circuit.

* * * * *